United States Patent
Zhang et al.

(10) Patent No.: US 7,391,251 B1
(45) Date of Patent: Jun. 24, 2008

(54) PRE-EMPHASIS AND DE-EMPHASIS EMULATION AND WAVE SHAPING USING A PROGRAMMABLE DELAY WITHOUT USING A CLOCK

(75) Inventors: Michael Y. Zhang, Palo Alto, CA (US); Henry P. Ngai, Coto De Caza, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 30 days.

(21) Appl. No.: 11/164,000

(22) Filed: Nov. 7, 2005

(51) Int. Cl.
*H03H 11/26* (2006.01)
(52) U.S. Cl. ..................... 327/261; 327/276
(58) Field of Classification Search ............... None
See application file for complete search history.

(56) References Cited

U.S. PATENT DOCUMENTS

| | | | | |
|---|---|---|---|---|
| 3,488,483 A * | 1/1970 | Freedman | ................ | 345/14 |
| 3,643,170 A | 2/1972 | Stanger | ................ | 328/162 |
| 3,810,067 A * | 5/1974 | Heidecker | ................ | 327/167 |
| 3,927,420 A * | 12/1975 | Hayashi et al. | ................ | 360/65 |
| 4,184,047 A | 1/1980 | Langford | ................ | 381/63 |
| 4,266,296 A | 5/1981 | Ishigaki | ................ | 455/303 |
| 4,350,879 A | 9/1982 | Feher | ................ | 377/28 |
| 4,555,734 A | 11/1985 | Fukui | ................ | 386/3 |
| 4,672,469 A | 6/1987 | Namiki et al. | ................ | 386/6 |
| 4,974,185 A | 11/1990 | Ohno et al. | ................ | 708/316 |
| 5,027,410 A | 6/1991 | Williamson et al. | ................ | 381/320 |
| 5,243,474 A * | 9/1993 | Mitsuhashi | ................ | 360/70 |
| 5,461,426 A * | 10/1995 | Limberg et al. | ................ | 348/475 |
| 5,533,048 A | 7/1996 | Dolan | ................ | 375/222 |
| 5,592,515 A | 1/1997 | Saban et al. | ................ | 375/340 |
| 6,049,703 A | 4/2000 | Staudinger et al. | ................ | 455/114.3 |
| 6,148,008 A | 11/2000 | Okamoto | ................ | 370/486 |
| 6,307,692 B1 * | 10/2001 | Brown et al. | ................ | 360/45 |
| 6,359,946 B1 | 3/2002 | Ryan | ................ | 375/371 |
| 6,499,111 B2 | 12/2002 | Mullarkey | ................ | 713/401 |
| 6,611,477 B1 * | 8/2003 | Speyer et al. | ................ | 368/113 |
| 6,853,220 B2 * | 2/2005 | De Laurentiis et al. | ................ | 327/108 |
| 7,061,283 B1 * | 6/2006 | Ghia et al. | ................ | 327/108 |
| 2004/0071219 A1 | 4/2004 | Vorenkamp et al. | ................ | 375/257 |
| 2005/0120870 A1 | 6/2005 | Ludwig | ................ | 84/661 |
| 2005/0276353 A1 * | 12/2005 | Bobier et al. | ................ | 375/322 |

* cited by examiner

*Primary Examiner*—Cassandra Cox
(74) *Attorney, Agent, or Firm*—g Patent LLC; Stuart T. Auvinen (57) ABSTRACT

An adjustable-delay filter performs wave shaping to emulate pre-emphasis or de-emphasis of transmission-line signals. The adjustable-delay filter uses analog components and does not need a clock. The receiver does not have to recover a bit-clock from the data stream, eliminating a clock recovery circuit. An input buffer receives the input signal and drives current to a summer and to an adjustable delay. The adjustable delay inverts and delays the current and drives a delayed, inverted current to the summer. The summer combines the delayed, inverted current and the current from the input buffer to generate an output signal. The delay time of the adjustable delay can be programmed by a user and is less than the bit period. After a signal transition, the output signal initially spikes higher, then falls back to a nominal level after the delay time has expired. The initial signal spike emulates de-emphasis or pre-emphasis.

14 Claims, 8 Drawing Sheets

PRIOR ART

PRIOR ART

PRIOR ART

PRE-EMPHASIS AND DE-EMPHASIS EMULATION AND WAVE SHAPING USING A PROGRAMMABLE DELAY WITHOUT USING A CLOCK

FIELD OF THE INVENTION

This invention relates to transmission-line waveform shaping, and more particularly to emulation of pre-emphasis and de-emphasis.

BACKGROUND OF THE INVENTION

Communications sometimes occurs across longer lines known as transmission lines. When the speed or frequency of signaling increases, shorter line lengths act as transmission lines. Special layout and termination of transmission lines is often needed to minimize reflections and optimize performance.

The shape of the waveform being driven onto the transmission line as an input can be adjusted to improve performance. The initial portion of the waveform can be increased in amplitude relative to the rest of the waveform, which is known as pre-emphasis.

Figure 1A:
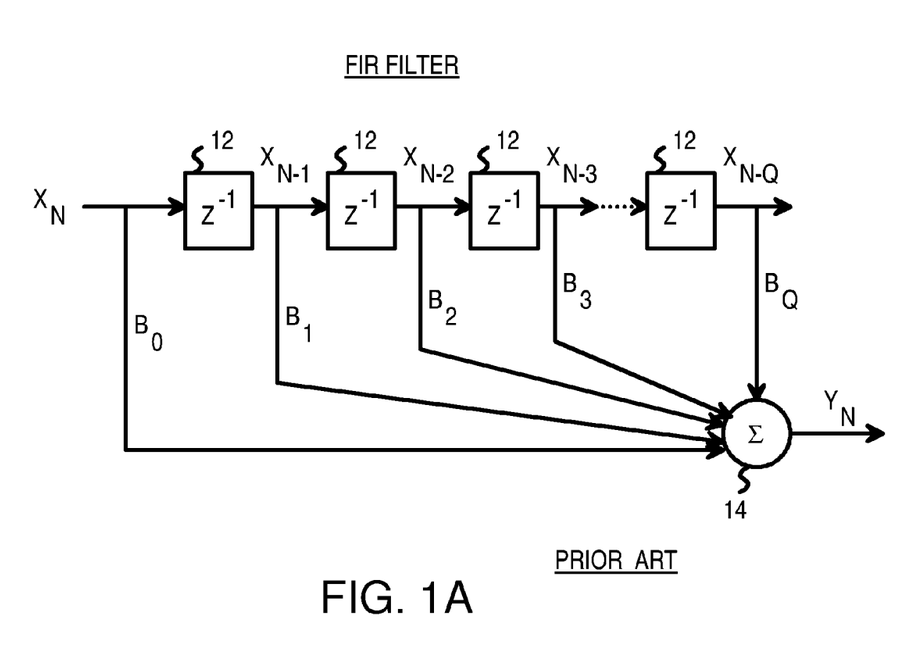
FIG. 1A shows a prior-art FIR filter.

FIG. 1A shows a prior-art FIR filter. An input signal, $X_N$ is altered or shaped by a finite impulse response (FIR) filter to generate output signal $Y_N$ which is input to the transmit end of a transmission line. Delay elements 12 each delay the signal by 1/Z, where Z is a time-domain function and 1/Z is a one-unit delay. Delayed signals $B_0$, $B_1$, $B_2$, ... $B_N$ have increasing delays and are summed by summer 14 to generate output $Y_N$. Delay elements 12 may be flip-flops, latches or delay lines in an analog or a digital implementation of the FIR filter.

Figure 1B:
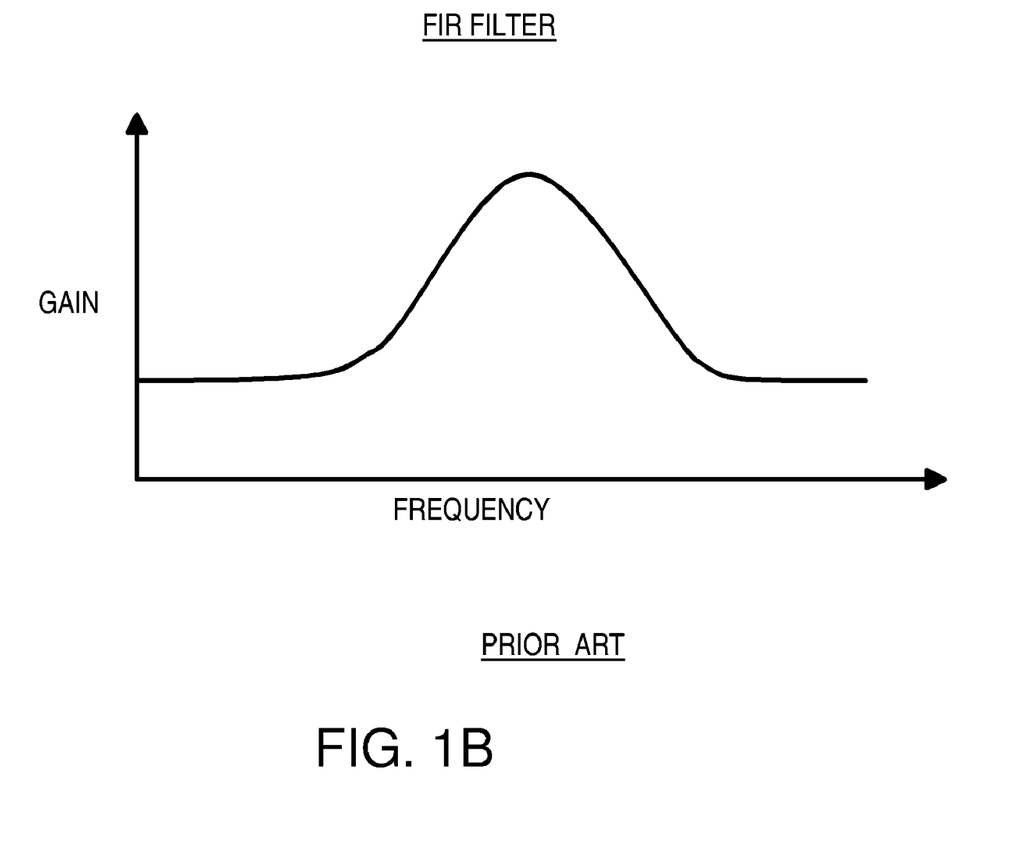
FIG. 1B is a graph of a FIR filter response.

FIG. 1B is a graph of a FIR filter response. A bell-shaped curve has a maximum gain at a peak frequency with decreasing gain for frequencies above and below this roll-off frequency.

Figure 2A:
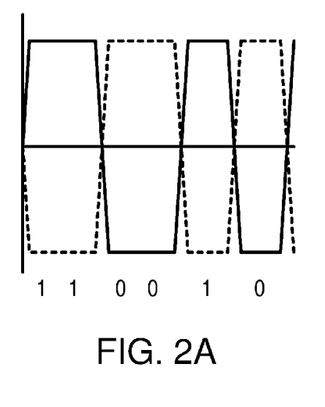
FIG. 2A shows a coded communication signal that is an input to a FIR filter.

FIG. 2A shows a coded communication signal that is an input to a FIR filter.

Figure 2B:
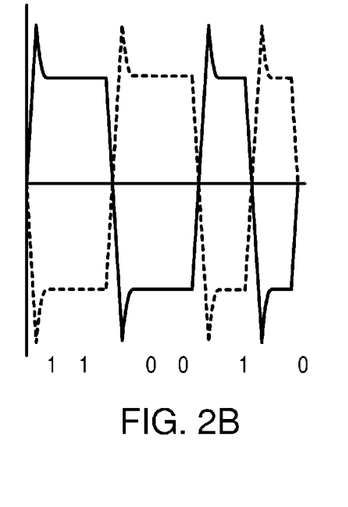
FIG. 2B shows the coded communication signal after shaping by pre-emphasis using the FIR filter.

FIG. 2B shows the coded communication signal after shaping by pre-emphasis using the FIR filter.

In FIG. 2A, a coded signal encodes the bit sequence 110010. A differential pair of lines carries the signal, with the solid line in the graph showing the true differential line and the dashed line in the graph showing the complement differential line. The coding of the bits stream onto the differential lines may be a non-return-to-zero (NRZ) code that switches differential lines on bit transitions.

When the bit stream changes from a 1 to a 0, or from a zero to a 1, the true and complement differential lines are switched. When the bit stream does not change, the differential lines do not switch. The bit stream may itself have been pre-encoded such as using a run-length limited code to ensure that bits switch frequently enough so that a clock may be extracted.

When a FIR filter such as shown in FIGS. 1A, 1B is applied to an input signal such as shown in FIG. 2A, the output waveform of FIG. 2B can be created. The output waveform of FIG. 2B contains pre-emphasis, since higher-amplitude spikes are added to each rising and falling edge of the waveform. These initial spikes may be 20 to 50% higher in amplitude than the flat portion of the waveform that follows each spike. These initial spikes can improve performance since a higher initial current occurs when first driving the transmission line during switching. Since the edge contains all the frequency components, and the following trace has a deterministic frequency response, pre-emphasis can be designed to cancel out the trace effect.

Waveform shaping may also be used on the far end of the transmission line, at the receiver. De-emphasis is sometimes used to shape the signal received from a transmission line. Higher frequency components of waveforms tend to attenuate more than lower frequency components over a transmission line. This frequency-dependent attenuation causes portions of the waveform after transitions to have a lower amplitude than portions farther away from transition edges at the far end of the transmission line. The graph of the differential signals, or eye pattern, closes immediately after the switching transitions. Pre-emphasis and de-emphasis both attempt to increase amplitude after transitions to open up the eye pattern.

Figure 3:
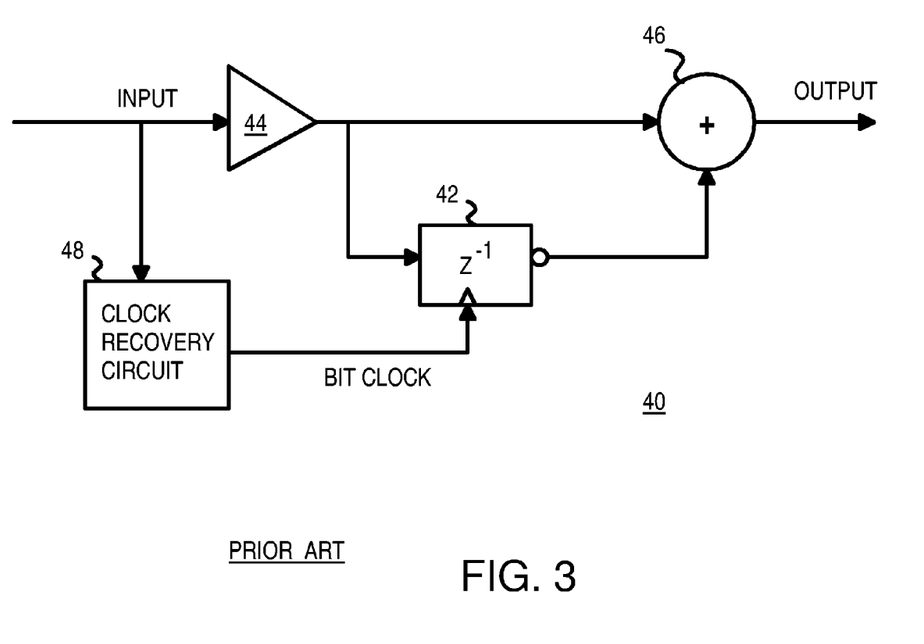
FIG. 3 shows a prior-art receiver with a clock recovery circuit that controls a filter delay element.

FIG. 3 shows a prior-art receiver with a clock recovery circuit that controls a filter delay element. The input signal INPUT from the far end of the transmission line is applied to buffer 44 and to clock recovery circuit 48. Clock recovery circuit 48 may include a phase-locked loop (PLL) that locks to the highest frequency of transitions of input signal INPUT. Thus the bit clock is recovered from input signal INPUT by clock recovery circuit 48 to generate a bit clock.

The bit clock from clock recovery circuit 48 is applied to the clock input of latch or flip-flop 42, which delays the buffered input signal from buffer 44 by one bit-clock period. Summer 46 sums the buffered input signal from buffer 44 and the 1-bit-clock-delayed signal from flip-flop 42 to generate the de-emphasized output OUTPUT that can be used by the receiving system.

Receiver 40 uses the recovered bit clock to delay the input signal for filtering. Clock recovery circuit 48 may be difficult to design and operate, since transitions may not always occur at the maximum rate, such as when sequence of 2, 3, or more 1's occur.

Figure 4A:
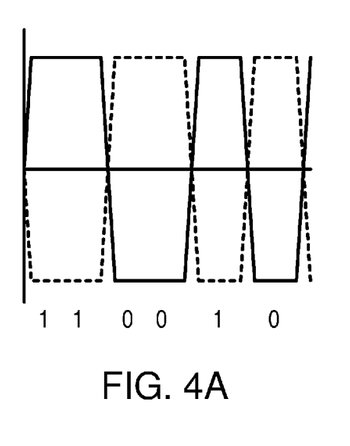
FIG. 4A shows an ideal signal received by a receiver that is NRZ encoded.
Figure 4B:
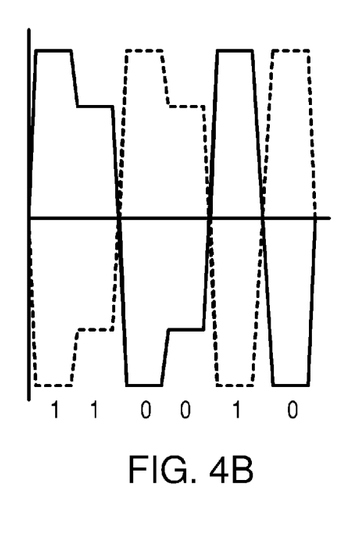
FIG. 4B shows the received signal after de-emphasis filtering.

FIG. 4A shows an ideal signal received by a receiver that is NRZ encoded. FIG. 4B shows the received signal after de-emphasis filtering. When the filter of FIG. 3 is applied to the ideal signal of FIG. 4A, the resulting waveform is shown in FIG. 4B and has been de-emphasized.

The delayed signal is inverted and added, or subtracted, from the buffered input signal, causing a larger signal to be produced for one bit-clock period after each switch transition of the input signal. After the first bit-clock period, the delayed signal changes to match the input signal, and the sum returns to the steady-state value. Thus a higher-amplitude initial pulse occurs for a pulse-width of exactly one bit-clock after each transition of the input signal.

While useful, the FIR filter is fairly complex and often has many delay stages. These delay states often require a clock. When a digital FIR filter is used, clocks are normally required, although an analog FIR filter may only need clocks for the delay stages. A simpler pre-emphasis device is desirable that does not require a clock. For de-emphasis, the delay flip-flop requires that the bit-clock be recovered from the input signal. Such clock recovery is undesirable. A de-emphasis system that does not need the recovered clock is desirable.

What is desired is a waveform shaping circuit that does not use a clock. A waveform shaping system that does not require a clock recovery circuit is desirable. Pre-emphasis and de-emphasis emulation without using a recovered clock is desirable.

DETAILED DESCRIPTION

The present invention relates to an improvement in emulation of pre-emphasis and de-emphasis. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that recovering the clock from a signal transmitted over a transmission line is undesirable. Clocked delays using the recovered clock are therefore also undesirable. Rather than use a clocked delay, the inventors realize that the delay can be adjustable such as by programming. The delay is adjusted to be less than the expected bit period.

Figure 5:
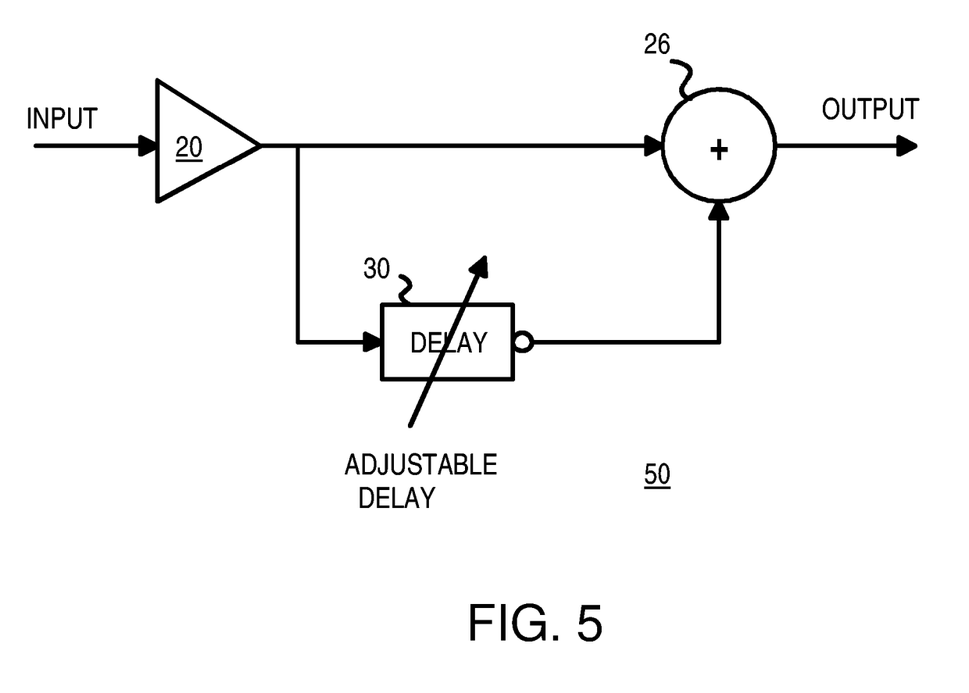
FIG. 5 shows a filter using an adjustable delay for de-emphasis or pre-emphasis.

FIG. 5 shows a filter using an adjustable delay for de-emphasis or pre-emphasis. An input signal INPUT may be received from a transmission line, or may be a signal to be transmitted over the transmission line. De-emphasis is added in the receiver, while pre-emphasis is added in the transmitter.

Buffer 20 receives the input signal and buffers the input signal, driving inputs to summer 26 and to adjustable delay 30. Adjustable delay 30 may be an analog delay such as a delay line. The delay through adjustable delay 30 may be adjusted such as by adjusting a gate-bias or power-supply voltage to transistors within the delay line, or by adjusting a variable resistance or a variable capacitance in one or more R-C delay stages, or even by muxing output signals from different stages in a sequence of stages.

Since the delay through adjustable delay 30 is adjusted by programming, selecting, or adjusting, there is no need for a clock to determine the delay. A bit clock does not need to be recovered from input INPUT. This greatly simplifies adjustable-delay filter 50 since no clock is needed.

Summer 26 adds the buffered input from buffer 20 to the delayed input from adjustable delay 30 to generate output OUTPUT, which has a shaped waveform. The delayed input may be inverted, and summer 26 performs addition, or summer 26 may perform subtraction of a non-inverted delayed input from adjustable delay 30. For example, summer 26 may be an analog summer that combines currents to generate a sum current. Buffer 20 could drive a positive current (such as a current source), while adjustable delay 30 inverts the current and drives a negative current (such as a current sink) to summer 26.

The exact shape and amplitude of the output waveform depends on summer 26. For example, the delay from adjustable delay 30 may be subtracted from the signal from buffer 20 with equal or non-equal weightings. The weight of the delayed signal from adjustable delay 30 may be reduced to reduce the amount of pre- or de-emphasis. The final summed current may be scaled up or down in amplitude, such as by a voltage divider, a current mirror, or a resistor circuit.

Figure 6A:
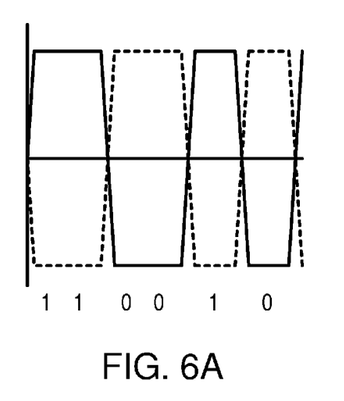
FIG. 6A shows an ideal input signal INPUT to the adjustable-delay filter of FIG. 5.
Figure 6B:
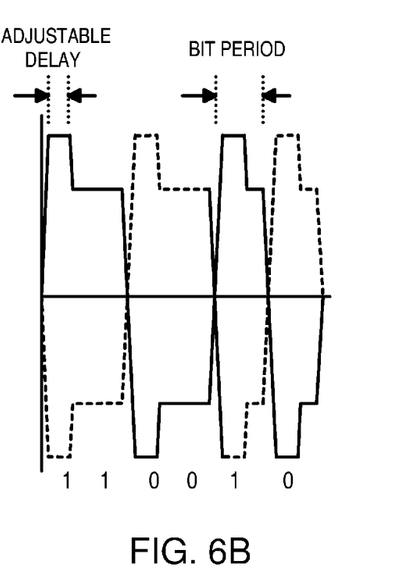
FIG. 6B shows the output from the adjustable delay filter.

FIG. 6A shows an ideal input signal INPUT to the adjustable-delay filter of FIG. 5, while FIG. 6B shows the output from the adjustable delay filter. A NRZ signal such as shown in FIG. 6A is applied as the input to the adjustable-delay filter of FIG. 5, which produces the output waveform of FIG. 6B.

After each transition, the waveform's amplitude is boosted by the summer adding the delayed signal before the transition propagates through the adjustable delay. The width of the boosted signal is determined by the delay time of adjustable delay 30. After the transition has propagated through adjustable delay 30, the sum from summer 26 decreases to the nominal level for the remainder of the time until the next transition.

The adjustable delay is set to be less than the bit period, as shown in FIG. 6B. This allows for higher transmission speeds.

The width of the adjustable delay may be set by a user or system designer. A nominal bit period is designated for communication from the transmitter. The adjustable delay may be set by programming a delay value or setting into a programmable register that controls the delay time through adjustable delay 30, such as by adjusting a power or bias voltage to the delay line, or by selecting outputs or taps within the delay line as the adjustable-delay output. The user or designer may experiment with different delay settings until an optimal setting is chosen. This is especially useful for system and board-level designs that have real transmission line traces that are hard to model. The adjustable pulse width for adjustable delay 30 may be set after trying several value and observing waveforms and error rates.

For example, the bit period for a 1 GHz signal is 1 nanosecond (ns). The delay for adjustable delay 30 may be set to 50% of this period, or 0.5 ns, or to 20% of the bit period (0.2 ns), or to some other value. The values may depend on the media. The adjustment may be determined by the media, and usually can be from 10% to 100%. If the value is less the 10%, the signal may look like pre-emphasis.

The absolute and relative amplitudes of the waveform may be set using bias currents and relative weights of inputs to summer 26, or by level-shifting, amplifying, or attenuating the output of summer 26.

Adjustable-delay filter 50 may act as a de-emphasis circuit without requiring recovery of the clock from data transmitted over the transmission line. Adjustable-delay filter 50 could also emulate a per-emphasis filer by reducing the delay for adjustable delay 30 to emulate the initial spikes of FIG. 2B. An over-driver could be used by the transmitter to emulate pre-emphasis in the transmitter, while adjustable-delay filter 50 is used in the receiver to emulate de-emphasis.

Figure 7:
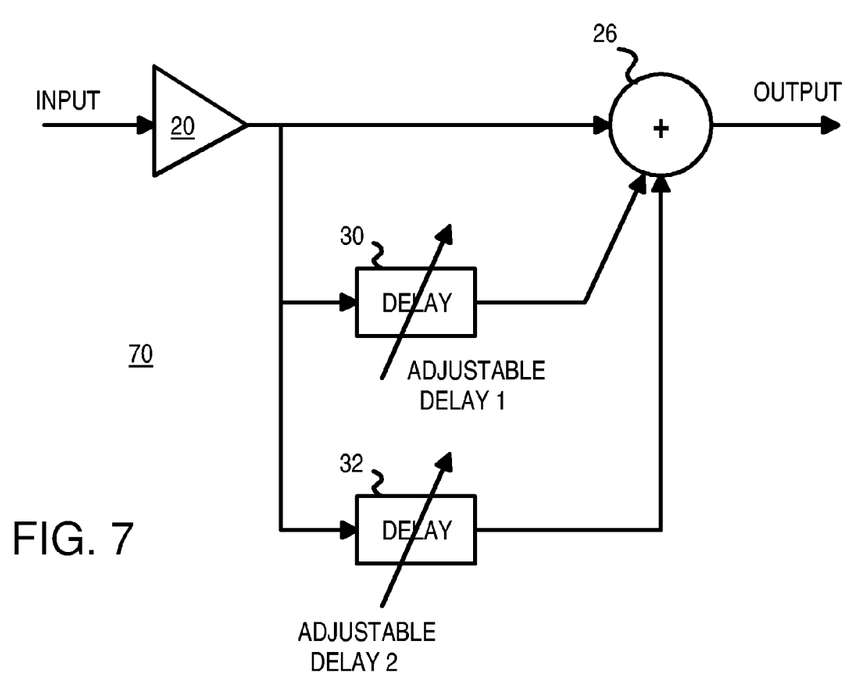
FIG. 7 shows a dual-adjustable-delay filter.

FIG. 7 shows a dual-adjustable-delay filter. Buffer 20 drives both adjustable delay 30 and adjustable delay 32 that are in parallel. Different delay values may be programmed into adjustable delay 30, 32, such as a short delay and a long delay that are both less than the bit period. Summer 26 receives delayed signals from both adjustable delay 30, 32 and generates a composite sum with the buffered input from buffer 20.

The composite sum can have a more complex waveform shape, such as an initial large-amplitude pulse created before propagation through either of adjustable delay 30, 32, that is overlapped by a medium-amplitude pulse created after the propagation delay through adjustable delay 30, but before the propagation delay through adjustable delay 32 has completed, and finally the steady-state pulse amplitude after the delays of both adjustable delay 30, 32 have elapsed.

Dual-adjustable-delay filter 70 is more complex than adjustable-delay filter 50 of FIG. 5, but allows for more precise waveform shaping. One of adjustable delay 30, 32 could be disabled when a simpler waveform is desired.

ALTERNATE EMBODIMENTS

Several other embodiments are contemplated by the inventors. For example delay circuits, summers, and buffers may be implemented in a variety of ways, and using a variety of technologies. A digital-signal processor (DSP) may be used. Input buffer 20 could have two separate outputs, one to summer 26 and another to adjustable delay 30, or could have a common output. The same signal is driven on both outputs with the same timing, so the two outputs could be considered to be the same signal even though driven onto two different physical lines. A current mirror could also be used to split the current. Adjustable delay 30 may have an initial buffer such as a voltage buffer that does not draw current from buffer 20, or the amount of current drawn by adjustable delay 30 may be accounted for in the design. Summer 26 may be a simple analog circuit that sums currents, such as a node connection, or may include weighting or multiplying circuits to change relative weights of the input signals.

All components may be analog components that do not require any clock as a digital component might require. For example, buffer 20 may convert a pair of differential signals to a single current that is output by buffer 20. The current may be positive when the true differential line is high and the complement differential line is low. When the differential lines switch, the current changes direction. Then the current becomes "negative" when the true differential line is low and the complement differential line is high. The current change into adjustable delay 30 is delayed, such as with an R-C delay or a number of buffering stages that eventually output the delayed input as a current that is inverted in polarity and any changes are delayed by the adjustable delay. Finally, summer 26 combines the current from buffer 20 with the inverted and delayed current from adjustable delay 30 to generate a combined current. Alternately, separate adjustable-delay filters 50 may be used, one for the true differential signal, and another for the complement differential signal.

Analog signals could be converted to or from digital signals at various locations, and could be further buffered, delayed, split, or combined. Even for an entirely analog adjustable-delay filter, the final output may feed into digital logic. While idealized input signals have been shown, actual signals may have noise, distortions, and other components. The idealized signals better show operation of the adjustable delay filter. The real output of the adjustable delay filter also could have various secondary components, yet still be useful.

Other components such as termination or series resistors, capacitors, buffers, etc. may be added. The transmission line may be a cable, or may be a backplane or wiring trace on a printed-circuit board (PCB) for high-speed signals. The transmission line could also be a twisted pair, telephone wires, or any media that carries electrical signals.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An adjustable-delay filter comprising:
   an input buffer receiving an input signal and generating a buffered input signal;
   an adjustable delay circuit, receiving the buffered input signal from the input buffer, and generating a delayed input signal that is delayed by an adjustable delay width; and
   a summer, coupled to the input buffer and to the adjustable delay circuit, for generating an output signal as a combination of the buffered input signal and the delayed input signal;
   wherein the summer combines a first current from the input buffer with a delayed current from the adjustable delay circuit to generate a combined current as the output signal;
   wherein the adjustable delay width is adjustable by a user;
   wherein the adjustable delay circuit inverts polarity of the first current from the input buffer to generate the delayed current that changes polarity after the adjustable delay width from a polarity change of the first current; wherein the adjustable delay circuit does not receive a clock;
   wherein data changes on a transmission line carrying the data after a bit period or after a multiple of the bit period;
   wherein the adjustable delay width is adjustable to values that are less than the bit period,
   whereby the adjustable delay width is less than the bit period and whereby current polarity changes are delayed by the adjustable delay circuit and inverted.

2. The adjustable-delay filter of claim 1 wherein the input buffer, the adjustable delay circuit, and the summer are analog components.

3. The adjustable-delay filter of claim 2 wherein the input buffer drives a current that reverses in polarity on data transitions as data changes state on a transmission line carrying the data,
   wherein the input buffer drives a polarity-reversing current to the summer and to the adjustable delay circuit.

4. The adjustable-delay filter of claim 3 wherein an initial amplitude of the output signal is boosted for an initial period of time determined by the adjustable delay width after the current reverses in polarity;

wherein the output signal returns to a steady-state amplitude that is less than the initial amplitude after the initial period of time after each data change;

whereby amplitude is initially boosted after each data change.

5. The adjustable-delay filter of claim 4 wherein the adjustable-delay filter is part of a receiver;

wherein the input signal is received from a transmission line or is derived from a signal sent over the transmission line;

wherein the output signal represent received data;

whereby amplitude is initially boosted after each data change to emulate de-emphasis.

6. The adjustable-delay filter of claim 5 wherein the receiver does not recover a bit clock from the signal sent over the transmission line, wherein the receiver is asynchronous.

7. The adjustable-delay filter of claim 4 wherein the adjustable-delay filter is part of a transmitter;

wherein the input signal is received from a transmitting system for transmission over a transmission line;

wherein the output signal is sent over the transmission line or is used to drive a signal over the transmission line;

whereby amplitude is initially boosted after each data change to emulate pre-emphasis.

8. The adjustable-delay filter of claim 4 wherein the adjustable delay circuit is delay-adjustable by adjusting a gate-bias or a power-supply voltage to transistors within the adjustable delay circuit, or by adjusting a variable resistance or a variable capacitance in one or more R-C delay stages, or by muxing output signals from different stages in a sequence of stages as the delayed input signal.

9. An adjustable-delay filter comprising:

an input buffer receiving an input signal and generating a buffered input signal;

an adjustable delay circuit, receiving the buffered input signal from the input buffer, and generating a delayed input signal that is delayed by an adjustable delay width; and a summer, coupled to the input buffer and to the adjustable delay circuit, for generating an output signal as a combination of the buffered input signal and the delayed input signal;

wherein the summer combines a first current from the input buffer with a delayed current from the adjustable delay circuit to generate a combined current as the output signal;

wherein the adjustable delay width is adjustable by a user;

wherein the adjustable delay circuit inverts polarity of the first current from the input buffer to generate the delayed current that changes polarity after the adjustable delay width from a polarity change of the first current; wherein the adjustable delay circuit does not receive a clock;

wherein the input buffer, the adjustable delay circuit, and the summer are analog components;

wherein the input buffer drives a current that reverses in polarity on data transitions as data changes state on a transmission line carrying the data;

wherein the input buffer drives a polarity-reversing current to the summer and to the adjustable delay circuit;

wherein an initial amplitude of the output signal is boosted for an initial period of time determined by the adjustable delay width after the current reverses in polarity;

wherein the output signal returns to a steady-state amplitude that is less than the initial amplitude after the initial period of time after each data change;

wherein the adjustable delay circuit is delay-adjustable by adjusting a gate-bias or a power-supply voltage to transistors within the adjustable delay circuit, or by adjusting a variable resistance or a variable capacitance in one or more R-C delay stages, or by muxing output signals from different stages in a sequence of stages as the delayed input signal;

a second adjustable delay circuit, receiving the buffered input signal from the input buffer, and generating a second delayed input signal that is delayed by a second adjustable delay width;

wherein the summer generates the output signal as a combination of the buffered input signal, the delayed input signal, and the second delayed input signal;

wherein the adjustable delay width and the second adjustable delay width are user programmable to different delay values, whereby amplitude is initially boosted after each data change and whereby current polarity changes are delayed by the adjustable delay circuit and inverted.

10. A clock-less waveform shaper comprising:

an input buffer, receiving an input signal, the input buffer driving a first current that switches in response to switching of the input signal;

a variable delay line, coupled to the input buffer, for generating a delayed current that switches after a delay time in response to the input buffer switching in response to switching of the input signal;

wherein the delay time is programmable by a user but does not vary during switching of the input signal except in response to the user changing programming of the delay time; and a combiner that receives the first current from the input buffer and receives the delayed current from the variable delay line, for generating a combined current as a combination of the first current and the delayed current, the combined current for generating an output signal;

wherein an amplitude of the output signal initially pulses to an emphasized level after switching of the first current until the delay time after switching has elapsed, the emphasized level having a larger amplitude than a nominal amplitude after the delay time but before the output signal switches again;

wherein the input signal switches up to a maximum rate determined by a bit period;

wherein the delay time is programmable but limited to less than the bit period, whereby amplitude is emphasized for a time determined by the delay time of the variable delay line that is programmable by the user.

11. The clock-less waveform shaper of claim 10 further comprising:

a transmission line that carries the input signal to the input buffer, wherein the clock-less waveform shaper performs de-emphasis in a receiver.

12. The clock-less waveform shaper of claim 11 wherein the receiver does not recover or extract a clock from the input signal.

13. The clock-less waveform shaper of claim 10 further comprising:

a transmission line that carries the output signal, wherein the clock-less waveform shaper performs pre-emphasis in a transmitter.

14. A de-emphasis emulating receiver comprising:
input buffer means, receiving an input signal, for generating a first current that switches in response to switching of the input signal;
variable delay inversion means, coupled to the input buffer means, for generating a delayed current that is an inverse of the first current that switches after a delay time in response to the input buffer means switching in response to switching of the input signal;
programmable means for programming the delay time of the variable delay inversion means;
sum means, receiving the first current from the input buffer means and the delayed current from the variable delay inversion means, for generating a combined current as a combination of the first current and the delayed current, the combined current for generating an output signal;
wherein an amplitude of the output signal initially pulses to an emphasized level after switching of the first current until the delay time after switching has elapsed, the emphasized level having a larger amplitude than a nominal amplitude after the delay time but before the output signal switches again;
wherein the input signal switches up to a maximum rate determined by a bit period;
wherein the delay time is programmable but limited to less than the bit period,
whereby amplitude is emphasized for a time determined by the delay time of the variable delay inversion means that is programmable by a user.

* * * * *